(12) United States Patent
Bulach

(10) Patent No.: US 8,471,164 B2
(45) Date of Patent: Jun. 25, 2013

(54) CAPACITIVE SWITCH

(75) Inventor: Eric Bulach, Meckenbeuren (DE)

(73) Assignee: RAFI GmbH & Co. KG (DE)

( * ) Notice: Subject to any disclaimer, the term of this patent is extended or adjusted under 35 U.S.C. 154(b) by 228 days.

(21) Appl. No.: 12/932,661

(22) Filed: Mar. 2, 2011

(65) Prior Publication Data

US 2011/0315535 A1    Dec. 29, 2011

(30) Foreign Application Priority Data

Mar. 2, 2010  (EP) ..................................... 10155169

(51) Int. Cl.
*H03K 17/975* (2006.01)
(52) U.S. Cl.
USPC ......................................................... 200/600
(58) Field of Classification Search
USPC ............................................ 200/600; 324/686
IPC .......................................... H03K 17/962,19/00
See application file for complete search history.

(56) References Cited

U.S. PATENT DOCUMENTS

| 6,897,390 B2* | 5/2005 | Caldwell et al. ............... 200/512 |
| 7,015,704 B1* | 3/2006 | Lang ............................... 324/661 |
| 2004/0189100 A1 | 9/2004 | Gasperi et al. | |
| 2011/0043227 A1* | 2/2011 | Pance et al. ..................... 324/681 |

FOREIGN PATENT DOCUMENTS

| DE | 197 03 404 | 8/1997 |
| DE | 10 2004 026836 | 12/2005 |
| EP | 0 054 306 | 6/1982 |

* cited by examiner

*Primary Examiner* — Vanessa Girardi
(74) *Attorney, Agent, or Firm* — Pandiscio & Pandiscio

(57) ABSTRACT

A capacitive switch (1) comprising a housing frame (2), a thin-walled cover plate (3) held thereon, a printed circuit board (4) with a copper layer (6) that generates a capacitive field (7) applied to a surface (5) of the circuit board (4) that faces the cover plate (3), the copper layer (6) being connected to an inside surface (8) of the cover plate (3), the capacitive switch (1) being adapted to ensure that electrical devices can be operated safely, in that changes in the capacitive field (7) are picked up by the switch (1) in a redundant manner. At least two sensor surfaces (17, 17', 18, 18') are disposed in the circuit board (4), and are each electrically connected via an integrated circuit (11, 12) to a microcontroller control and evaluation unit, and the circuit board (4) functions as an insulation between the copper layer (6) and the sensor surfaces (17, 17', 18, 18'), and both integrated circuits (11, 12, 11', 12') are controlled alternately by the microcontroller (13) for measuring the capacitive field (7) of the copper layer (6).

9 Claims, 4 Drawing Sheets

CAPACITIVE SWITCH

BACKGROUND OF THE INVENTION

1. Field of the Invention

The invention relates to a capacitive switch of a kind used in a large number of applications. A capacitive field generated by a copper layer radiates in the direction of a user interface. As soon as the capacitive field is disrupted, for example, by being penetrated by a human finger, the field value changes. An integrated circuit arranged adjacent and close to the copper layer permanently measures these changes in the capacitive field, with the effect that an electrical switching signal can be generated by means of a microcontroller that is electrically connected to the integrated circuit when the capacitive field of the copper layer rises above or drops below a preset limit value.

2. Description of the Prior Art

It has proved to be disadvantageous in a capacitive switch of this kind that it cannot be used in electrical devices which have to fulfill a certain safety requirement. For example, false switchings can arise because the integrated circuit no longer functions correctly after a certain service life, or because the synchronisation of interrogating the capacitive field from the copper layer is disrupted because of the integrated circuit of the microcontroller that controls the integrated circuit and picks up its signals. Other incorrect switchings arise if the capacitive field is inadvertently disrupted, for example, in the boundary area, when there was no intention for the capacitive field to be influenced.

If an incorrect switching of the capacitive switch occurs and the switch is used as a movement initiator for a machine tool, then the control unit of the machine tool will not function or it will be controlled in a fully inadvertent manner. Consequently, this can lead to possibly serious accidents or other malfunctions in operation; possibly, the function of the machine tool will be significantly impaired as a result.

Therefore, for many years now, there has been a significant need for the capacitive switches of the prior art to be made capable of being used in other electrical devices as well, the switching and control functions of which should take place reliably and on a continuous basis, because these capacitive switches have to demonstrate a certain level of switching security.

SUMMARY OF THE INVENTION

It is therefore the purpose of the present invention to provide a capacitive switch of the aforementioned kind which guarantees that electrical devices can be operated in such a way as to satisfy a certain safety requirement profile, in that the changes in the capacitive field are picked up on a redundant basis by the switch.

Due to the fact that there are at least two sensor surfaces installed in the printed circuit board, these surfaces are each electrically integrated and controlled via one integrated circuit by the microcontroller as the control and evaluation unit, and the surfaces alternately measure the capacitive field of a plastic layer, a guarantee is provided that there will be sufficient reliability for operation of the capacitive switch, because the number of sensor surfaces allows for malfunctions to be detected and/or excluded. If, for example, one of the two integrated circuits on the particular sensor surface does not function correctly, then the microcontroller as the evaluation and control unit does not generate an electrical signal, because the second integrated circuit with its sensor surface does not confirm the interrogation values of the first integrated circuit. It is only when the electrical information from both integrated circuits and their sensor surfaces match that the microcontroller generates a corresponding electrical switching signal.

It is particularly advantageous when two pairs of sensor surfaces are installed in the printed circuit board and when the two sensor surfaces that form each pair are spaced apart from one another and are arranged in parallel to one of the sensor surfaces of the second pair, because this arrangement significantly increases the integration redundancy.

The printed circuit board is manufactured from a material with electrically insulating properties, with the effect that there is no electrical connection between the copper layer and the sensor surfaces and between the sensor surfaces themselves, but rather that these are electrically separated from one another.

BRIEF DESCRIPTION OF THE DRAWINGS

The drawings show two illustrative embodiments of a capacitive switch configured in accordance with the present invention, the details of which are explained below. In detail.

DESCRIPTION OF THE PREFERRED EMBODIMENTS

Figure 1:
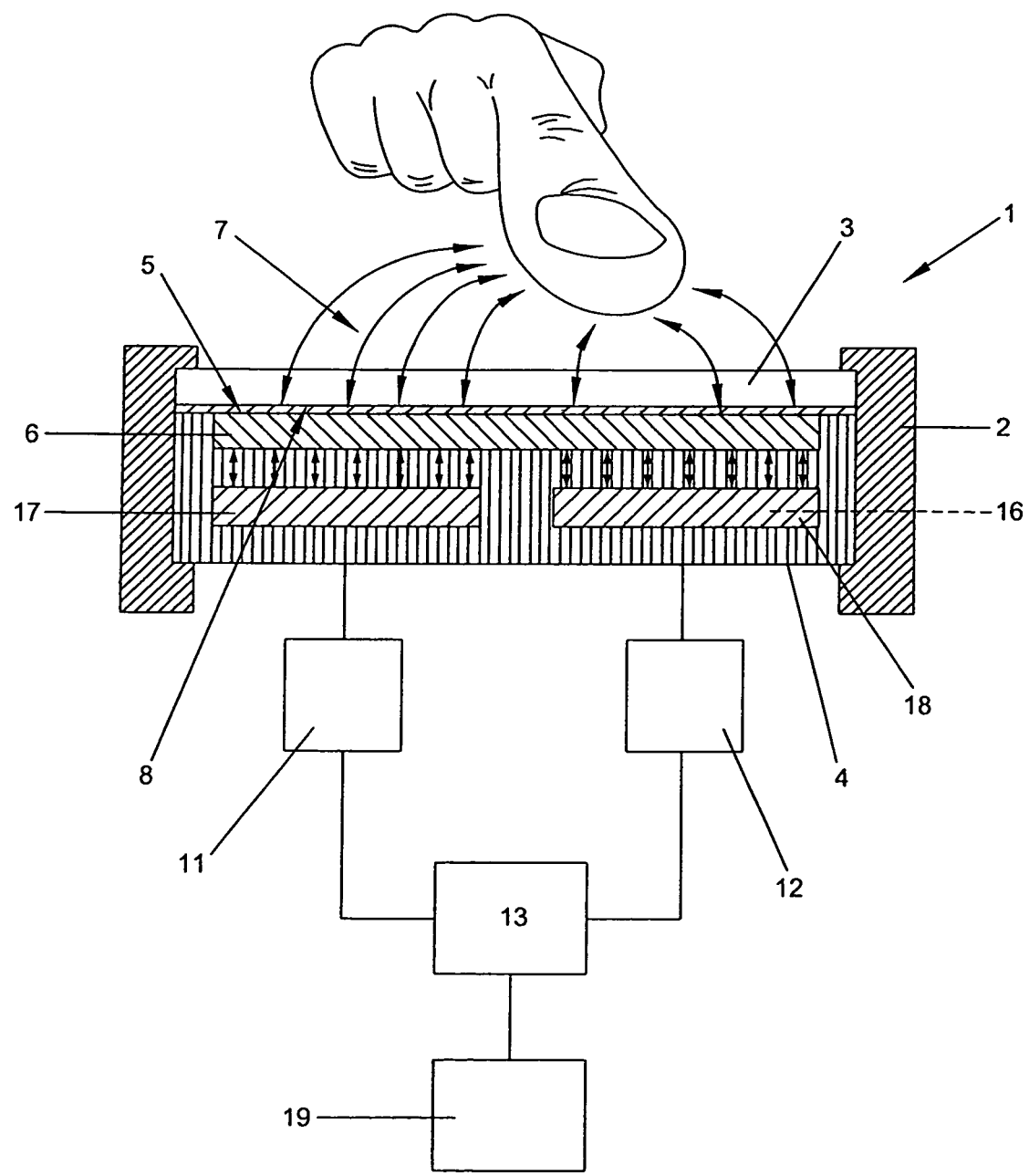
FIG. 1 shows a first embodiment of a capacitive switch, with a printed circuit board in which there are two sensor surfaces which alternately scan the capacitive field generated by a copper layer, in which case each of the sensor surfaces is electrically connected to a microcontroller via an integrated circuit, in a sectional view.

FIG. 1 shows a capacitive switch 1 which is to be used for controlling an electrical device, for example, as the control unit for a machine tool. In order to check the switching and control function of the capacitive switch 1 in as redundant a way as possible, with the effect that its function corresponds to a specified legal safety standard, the capacitive switch 1 consists of two sensor surfaces 17 and 18 installed in a printed circuit board 4, by means of which a capacitive field 7 generated by a copper layer 6 on the surface 5 of the printed circuit board 4 is picked up, as explained in more detail below.

The printed circuit board 4 and the copper layer 6 are installed in a housing frame 2. The copper layer 6 is sealed to the outside by means of a thin-walled, transparent or semi-transparent cover plate 3, with the effect that the sensor surfaces 17, 18 arranged under the cover plate 3 are encapsulated with an air-tight seal towards the outside. The sensor surfaces 17 and 18 are electrically connected to two integrated circuits 11 and 12. The integrated circuits 11 and 12 are configured in accordance with prior art as semiconductors.

The sensor surfaces 17, 18 run in a common plane 16 which is parallel to the copper layer 6 and is arranged at a distance from it.

The printed circuit board 4 completely encloses the corresponding sensor surface 17 or 18; this is in addition made from an insulating material, with the effect that the copper layer 6 and the sensor surfaces 17, 18 are electrically isolated from one another.

Figure 5:
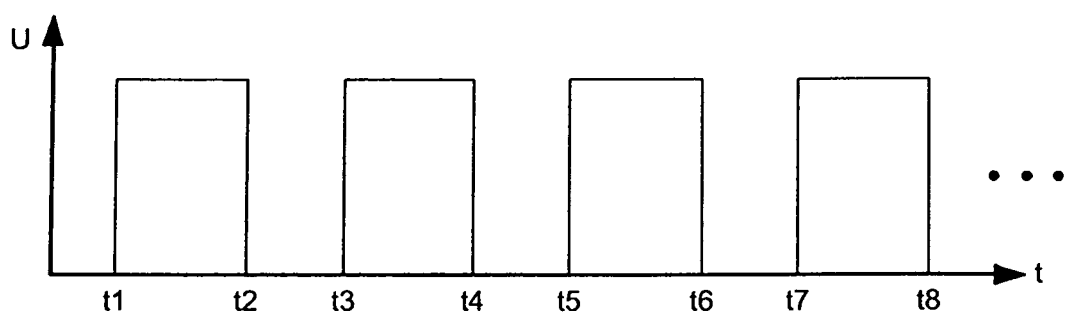
FIG. 5 shows a circuit diagram for controlling the integrated circuits in accordance with FIG. 1 or 2.

FIG. 5 shows the monitoring cycle of the particular circuit 11 or 12, wherein a microcontroller 13 activates the two integrated circuits 11 and 12 alternately, with the effect that in accordance with the illustrated control function, one of the two sensor surfaces 17 or 18 picks up the capacitive field 7 generated by the copper layer 6 and emanating outwards in the direction of the cover plate 3.

Now, if a human finger is inserted into the capacitive field 7, for example, the value of the field changes. Irrespective of which of the two integrated circuits 11 or 12 is currently enabled by the microcontroller 13 for picking up the capacitive field 7, the corresponding sensor surface 17 or 18 detects the change in the capacitive field 7 and this change in the capacitive field 7 is passed on to the microcontroller 13 via the corresponding integrated circuit 11 or 12. As soon as the other of the two sensor surfaces 17 or 18 is enabled by the microcontroller 13, this picks up the change in the capacitive field 7 in the same manner, with the effect that the first switching signal of the corresponding integrated circuit 11 or 12 is confirmed by the second integrated circuit 11 or 12. This integration cycle means that the first integration is checked and consequently the false switching functions are reduced, because it is only when both sensor surfaces 17 and 18 establish a change in the capacitive field 7 and have passed this on to the microcontroller 13 that the microcontroller 13 generates an electrical switching signal which is passed on to the machine tool by means of an interface 19.

Figure 2:
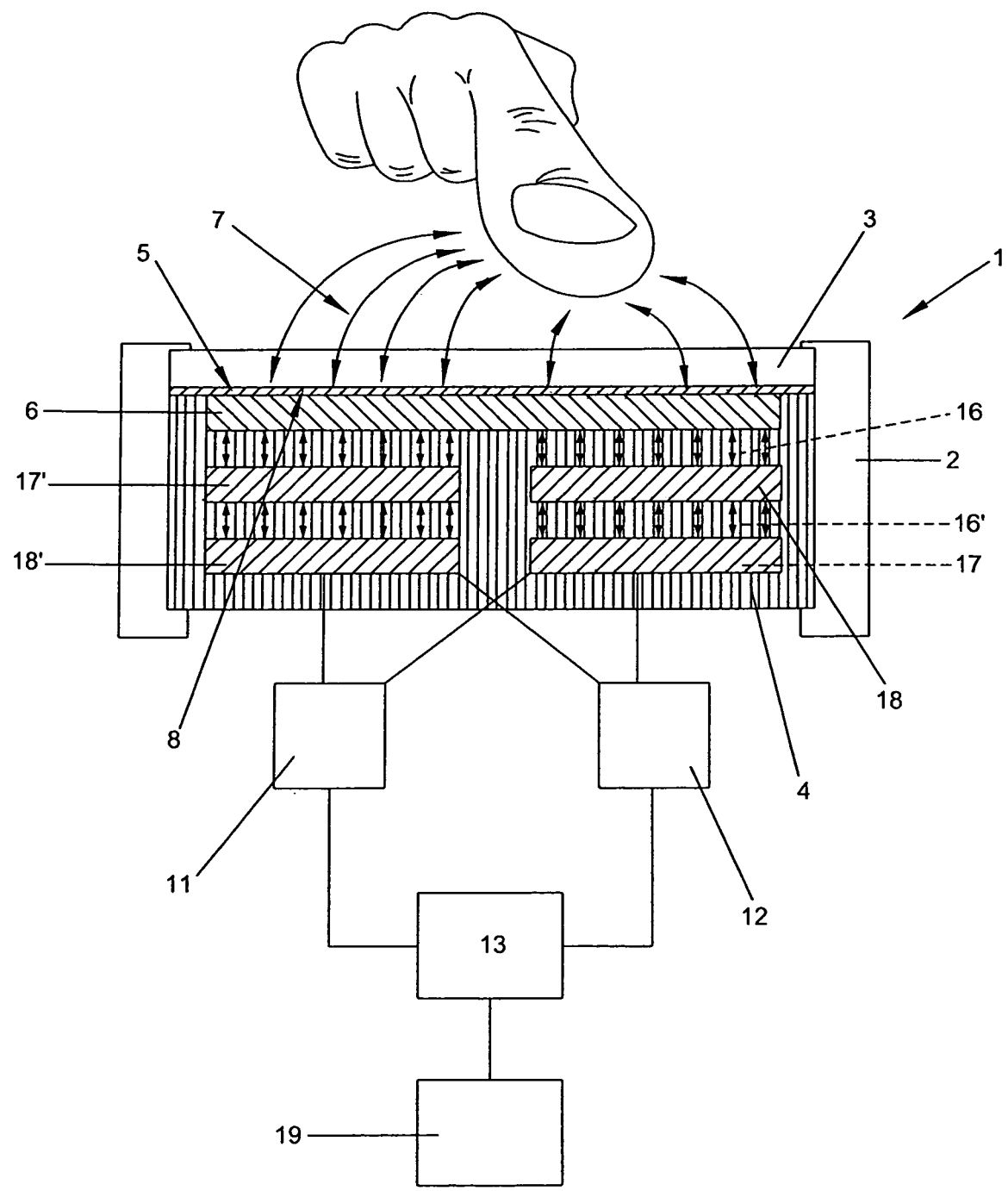
FIG. 2 shows a second embodiment of a capacitive switch, with a printed circuit board in which there are four sensor surfaces which alternately and in pairs scan the capacitive field generated by a copper layer, in which case each pair of sensor surfaces is electrically connected to a microcontroller via an integrated circuit, in a sectional view.

FIG. 2 shows four sensor surfaces 17, 18, 17', 18'. Two of the four sensor surfaces 17, 17', 18, 18' are connected together in pairs to make a common integration unit. In this case, each of the sensor surfaces 17 and 18; or 17' and 18; run in a common plane, which is aligned in parallel with the copper layer 6 and at a different spacing from it. With regard to the copper layer 6, the sensor surfaces 17 and 18 are arranged between the copper layer 6 and the sensor surfaces 17' and 18'.

Furthermore, the two pairs of sensor surfaces 17 and 17; or 18 and 18; are arranged spatially with a lateral offset from one another, although they are installed in the printed circuit board 4 aligned one above the other in relation to the other sensor surface 17, 17', 18, 18' of the other pair in each case. This constructive arrangement of sensor surfaces 17, 17', 18, 18' means that the integration reliability is increased further, because now the change in the capacitive field 7 is picked up by two pairs of sensor surfaces 17, 17' or 18, 18', with the effect that the redundancy of the capacitive switch 1 is increased.

Figure 3:
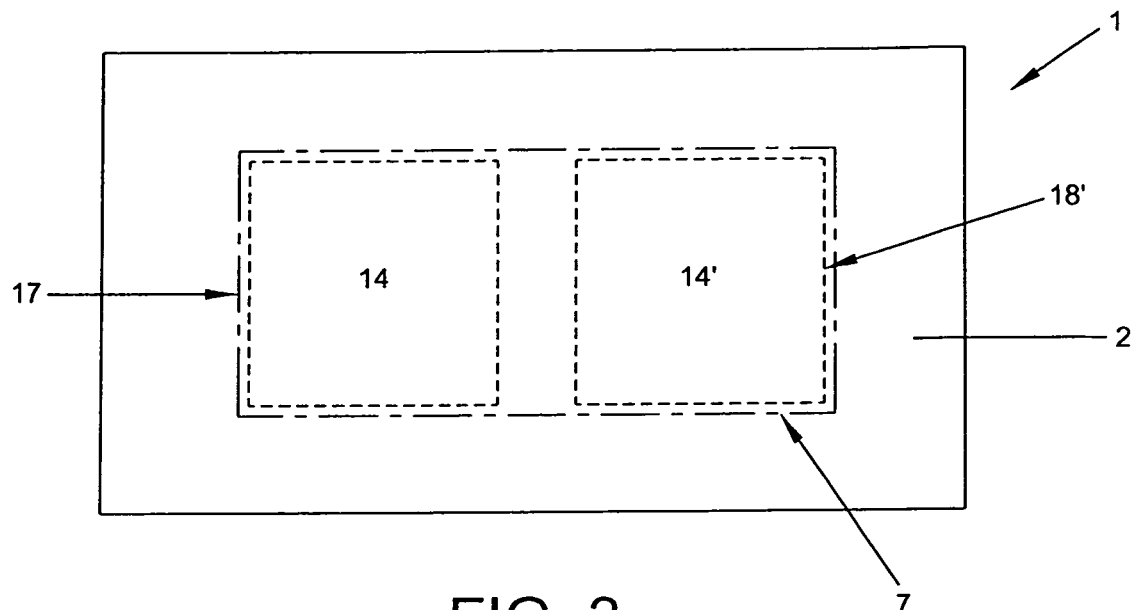
FIG. 3 shows the capacitive switch in accordance with FIG. 1, in a plan view, in which the copper layer encompasses the measuring surfaces generated by the two sensor surfaces.

FIG. 3 shows that a measuring surface 14 or 15 formed by the sensor surfaces 17, 18 is the same size, and that the capacitive field 7 generated by the copper layer 6 approximately corresponds in extent to that generated by the measuring surfaces 14 and 15.

Figure 4:
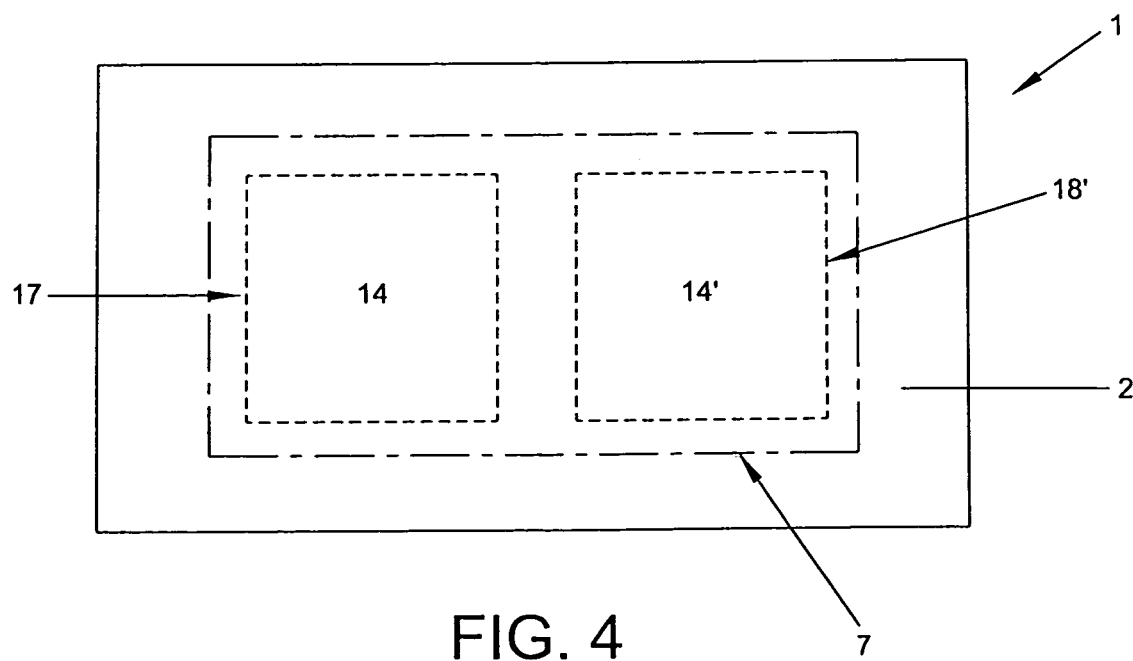
FIG. 4 shows the capacitive switch in accordance with FIG. 2, in which the capacitive field radiated by the copper layer is larger than the measuring surfaces formed by the sensor surfaces, in a plan view.

FIG. 4 shows that the measuring surfaces 14 and 15 cover a smaller surface than that generated by the capacitive field 7.

The sensor surfaces 17 and 18, or 17' and 18, in FIG. 2 are spaced apart from one another, with the effect that a space is formed between them. Even when the capacitive field 7 in this space is disrupted by the penetration of a human finger, this will not affect the switching reliability of the capacitive switch 1, because the two sensor surfaces 17 and 18, or the two pairs of sensor surfaces 17 and 18, or 17' and 18, are integrated alternately by the microcontroller 13 and the integrated circuits 11, 12.

FIGS. 3 and 4 show the measuring surfaces 14 or 15 with a rectangular configuration. Depending on the cross-sectional area of the particular sensor surface 17, 17' and 18, 18' used, the outer contour of the measuring surface 14 or 14' can vary. It is conceivable, for example, for the first sensor surface to have a T-shape and the second sensor surface 18 to have a U-shape, with the effect that the first sensor surface 17 is partially enclosed by the second sensor surface 18. The outer contour of the corresponding measuring surface 14 or 15 can also be configured as round, elliptical or in a polygonal shape—this depends on the application profiles to be provided on the capacitive switch 1.

The invention claimed is:

1. A capacitive switch (1), comprising a housing frame (2) by means of which a thin-walled cover plate (3) is held, a printed circuit board (4) with a copper layer (6) that generates a capacitive field (7) applied to a surface (5) of the printed circuit board (4) that faces the cover plate (3), with the copper layer (6) connected to an inside surface (8) of the cover plate (3),
wherein at least two sensor surfaces (17, 17', 18, 18') are installed in the printed circuit board (4), the surfaces (17, 17', 18, 18') each being electrically connected via an integrated circuit (11, 12) to a microcontroller (13) as the control and evaluation unit, and the printed circuit board (4) functions as an insulation between the copper layer (6) and the sensor surfaces (17, 17', 18, 18'), and both integrated circuits (11, 12, 11', 12') are controlled alternately by the microcontroller (13) for measuring the capacitive field (7) of the copper layer (6).

2. The switch in accordance with claim 1,
wherein
the sensor surfaces (17, 18 or 17', 18') of the integrated circuits (11, 12) are arranged in pairs in a plane running parallel to the copper layer (6).

3. The switch in accordance with claim 1
wherein
two pairs of sensor surfaces (17, 17' and 18, 18') are provided in the printed circuit board (4), the two sensor surfaces (17, 17') forming a first pair which are offset laterally from one another and are positioned one above the other in alignment with a second pair of sensor surfaces (18, 18').

4. The switch in accordance with claim 1,
wherein
the two sensor surfaces (17, 18) are disposed on different height levels in the printed circuit board.

5. The switch in accordance with claim 1,
wherein
the sensor surfaces (17, 17', 18, 18') are spaced apart from one another and generate measuring surfaces (14, 14') which correspond to the extent of the sensor surfaces (17, 18).

6. The switch in accordance with one claim 5,
wherein
each of the measuring surfaces (14) formed by the sensor surfaces (17, 17', 18, 18') is of the same size.

7. The switch in accordance with claim 5,
wherein
the measuring surfaces (14, 14') formed by the sensor surfaces (17, 17', 18, 18') are configured as different geometrical figures, and a selected distance is provided between the adjacent measuring surfaces (14, 14').

8. The switch in accordance claim 7,
wherein
the measuring surface (14) of the first sensor surface (17) is configured as a rectangular frame and the measuring surface (14') of the second sensor surface is configured as a rectangle, and the first measuring surface (14) encloses the second measuring surface (14').

9. The switch in accordance with claim 7,
wherein
the measuring surface (14) formed by the first sensor surface (17) is configured with a T-shape and the measuring surface (14') formed by the second sensor surface (18) is configured with a U-shape, and the measuring surface (14) of the first sensor surface (17) is partially enclosed by the measuring surface (14') of the second sensor surface (18) and is spaced therefrom.

\* \* \* \* \*